(12) United States Patent
Setayesh et al.

(10) Patent No.: US 7,547,926 B2
(45) Date of Patent: Jun. 16, 2009

(54) HETEROJUNCTION WITH LINKAGES BETWEEN AN ELECTRON DONOR AND AN ELECTRON ACCEPTOR IN A BLEND

(75) Inventors: Sepas Setayesh, Eindhoven (NL); Johannes W. Hofstraat, Veldhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 122 days.

(21) Appl. No.: 11/570,436

(22) PCT Filed: Jun. 7, 2005

(86) PCT No.: PCT/IB2005/051844

§ 371 (c)(1),
(2), (4) Date: Dec. 12, 2006

(87) PCT Pub. No.: WO2005/124886

PCT Pub. Date: Dec. 29, 2005

(65) Prior Publication Data

US 2007/0235727 A1    Oct. 11, 2007

(30) Foreign Application Priority Data

Jun. 16, 2004  (GB) .................... 0413398.9

(51) Int. Cl.
H01L 29/06    (2006.01)
H01L 31/072   (2006.01)
H01L 31/109   (2006.01)
H01L 31/0328  (2006.01)
H01L 31/0336  (2006.01)
H01L 33/00    (2006.01)

(52) U.S. Cl. ............................ 257/183; 257/12; 257/94
(58) Field of Classification Search .................. 257/40, 257/12, 94–97, 183–189, E51.01, E29.188
See application file for complete search history.

(56) References Cited

U.S. PATENT DOCUMENTS

| 4,389,698 A | 6/1983 | Cibie |
| 4,935,665 A | 6/1990 | Murata |
| 5,196,144 A | 3/1993 | Smith et al. |
| 5,321,586 A | 6/1994 | Hege et al. |
| 5,670,791 A | 9/1997 | Halls et al. |
| 5,890,794 A | 4/1999 | Abtahi et al. |
| 6,422,718 B1 | 7/2002 | Anderson et al. |
| 7,329,709 B2 * | 2/2008 | Gaudiana et al. ............ 525/403 |

(Continued)

FOREIGN PATENT DOCUMENTS

EP    1300430 A1    4/2003

(Continued)

OTHER PUBLICATIONS

Jonathan J. M. Halls et al; "Photodiodes Based on Polyfluorene Composites: Influence of Morphology", Adv. Mater 2000, 12, No. 7.

(Continued)

Primary Examiner—Cuong Q Nguyen (57) ABSTRACT

An electronic device comprising a heterojunction, wherein the heterojunction comprises a blend comprising an electron donor and an electron acceptor; and wherein the blend is treated so as to form one or more linkages between the electron donor and/or electron acceptor in the treated blend.

18 Claims, 2 Drawing Sheets

AFM pictures of MDMO-PPV/1 before (a) and after annealing (b)

U.S. PATENT DOCUMENTS

2006/0011233 A1    1/2006    Sariciftci et al.

FOREIGN PATENT DOCUMENTS

| EP | 1357163 | B1 | 5/2006 |
| GB | 2375814 | A | 11/2002 |
| WO | 9909603 | A1 | 2/1999 |
| WO | 9939394 | A1 | 8/1999 |
| WO | 9939395 | A1 | 8/1999 |
| WO | 0022682 | | 4/2000 |
| WO | 0186734 | A1 | 11/2001 |

OTHER PUBLICATIONS

J. Parisi et al; "Charge Transfer and Transport in Polymer-Fullerene Solar Cells", Faculty of Physics, Dept. of Energy and Semiconductor Research, Univ of Oldenburg. Sep. 20, 2002.

J. Wang et al; "Color Characterizatin of Large Area Polymer Image Sensors", UNIAX Corp. Santa Barbara, CA, May 18, 2000.

Christoph Winder et al; "Excited State Spectroscopy in Polymer Fullerene Photovoltaic Devices Under Operatioin Conditions", Synthetic Metals 139, 2003, pp. 577-580.

Naturforsch, Z., Proc. 11th Workshop Quantum Solor Enegergy Conversion. 1999 Wildhaus Switzerland.

* cited by examiner

Current-voltage (I-V) characteristics in the dark (black circles) and under illumination (open circles) of a MDMO-PPV/1 device with a Ca/Al cathode

AFM pictures of MDMO-PPV/1
before (a) and after annealing (b)

FIG. 2

HETEROJUNCTION WITH LINKAGES BETWEEN AN ELECTRON DONOR AND AN ELECTRON ACCEPTOR IN A BLEND

Organic semiconducting materials have been successfully applied in a number of electronic devices e.g., in light-emitting devices (LEDs), in transistors for labels and tags, in pixel switches for thin displays and for construction of integrated circuits for various simple functions. In general, the organic semiconductors for these devices are applied as homogeneous layers comprising a single constituent. For some applications, however, it is advantageous to use a blend or mixture of materials. One example of an application in which such blends can offer advantages are photovoltaic cells, such as those described in Wang et al, Organic Electronics, 1, 33 (2000)), which can be used as solar cells or as photodetectors. Other applications include ambipolar transistors and electroluminescent layers.

U.S. Pat. No. 5,670,791 discloses a photoresponsive device with a photoresponsive zone comprising a polymer blend. The photoresponsive zone is in the form of a polymer having regions of a first semiconductive polymer and regions of a second semiconductive polymer phase-separated from the first semiconductive polymer.

WO 99/09603 describes organic diodes with switchable photosensitivity comprising organic photolayers in the photodiodes and a detector circuit, which applies a reverse or forward bias voltage across the diodes.

WO 99/39395 discloses organic photodetectors with switchable photosensitivity using organic photoactive layers in electrode/organic/electrode structures. The photosensitivity can be switched on and off by biasing voltage across the detectors.

WO 99/39394 describes the fabrication of two-terminal electric microswitches comprising thin semiconductor films and the use of these microswitches to construct column-row (x-y) addressable microswitch matrices.

WO 01/86734 discloses a photovoltaic cell having a photoactive layer consisting of a conjugated polymer component as electron donor and a fullerene component as an electron acceptor. According to WO 01/86734, advantageous conditions are created when both components and the mixed phases thereof have an average maximum particle size of less than 500 nm, at least in certain sections of the photovoltaic layer.

WO 03/079400, EP 1300 430 and EP 1 357 163 describe specific compounds which can be polymerized in situ on certain devices. However, these documents do not describe devices comprising heterojunctions. Moreover, the documents do not disclose the stabilization of separate phases in heterojunctions by the treatment of blends of materials to form linkages between the same and/or different materials.

Organic semiconducting materials may offer a variety of processing advantages compared to conventional inorganic semiconductors. Thus, organic semiconducting materials can be deposited on large-area flexible substrates at low temperatures, which is attractive for the production of low-cost arrays of devices.

While the stability of the materials for LEDs has reached industrial requirements, photovoltaic devices produced using a blend of at least two different materials (donor/acceptor (D/A)) lack the desired lifetime (J. C. Hummelen et al, Proc. SPIE, 4108, 76 (2001).

Semiconducting polymers can produce a photovoltaic effect. However, the efficiency of devices comprising these polymers may be very poor, since the excited states can recombine and produce photons rather than separate charges. Typically for photovoltaic applications, use is made of blended semiconductor materials, which comprise a mixture of electron donor and electron acceptor functions. Such materials have been shown to possess ambipolar transistor properties as well.

Blends applied thus far comprise a mixture of a low molecular weight fullerene as acceptor and a semiconductive polymer as donor. Yu et al (Science, 270, 1789 (1995)) have described a proposed approach to the preparation of solar cells based on an interpenetrating blend of donor (conjugated polymer) and acceptor ($C_{60}$) sandwiched between two asymmetric contacts.

In the most efficient devices currently known, the photovoltaic layer consists of a percolating network of donor and acceptor materials, forming a bulk heterojunction, which in most cases has been spin coated out of the same solution, on top of a hole-transport material, or the anode. The light incident on the layer is absorbed by the donor material and populates its excited state. From the excited state of the donor an electron is transferred to the acceptor, leaving a hole on the donor. The charges are then transported via the potential difference in the device to the cathode and anode, resulting in a voltage difference across the device.

Unfortunately, the blends known in the art may lack long-term stability, since in general they do not represent a thermodynamically stable morphology. The dissimilar materials may phase separate under certain conditions, resulting in a significant reduction of lifetime of the device, as described in Wang et al, Organic Electronics, 1, 33 (2000)).

The efficiency of bulk heterojunction devices consisting of poly[2-methoxy-5-(3,7-dimethyloctyloxy)]-p-phenylene vinylene (MDMO-PPV) and 1-(3-methoxycarbonyl)-propyl-1-1-phenyl-(6,6)$C_{61}$ (PCBM) have been increased up to 3% according to the group of Saricifci. The results are described in Brabec et al Adv. Funct. Mater. 11, 15 (2001) and Shaheen et al, Appl. Phys. Lett. 78, 841 (2001). However, the performances of these types of solar cells are very sensitive to the morphology of the blend. In particular, phase separation and clustering of the fullerene can occur due to the operational heat through illumination, thus reducing the effective donor/acceptor interfacial area and the efficiency of the devices.

Phase separation of heterogeneous materials, such as polymer blends or organic-inorganic hybrids is a common phenomenon, particularly when the temperature is close to the glass transition temperature of the organic material, and the mobility of the materials increases. Illumination of the devices may also result in loss of performance, either directly or indirectly since the temperature of the device increases. Similar phenomena are observed for the reliability of other devices based on heterogeneous materials.

The efficiency of the devices may also be highly dependent on the solvent used for the spin coating of the active materials, indicating the formation of different morphologies, as described in J. J. Dittmer et al, Adv. Mater. 12, 1270 (2000) and Shaheen et al, Appl. Phys. Lett. 78, 841 (2001).

We have shown that since spin coating of the blend does not lead to a thermodynamically stable morphology, the structure of the network can be further changed by exposure to heat and/or light i.e., it is not thermodynamically stable during use. This can result in a deterioration of the performance and the lifetime of the device.

The present invention seeks to overcome or ameliorate these disadvantages.

Accordingly, in a first aspect the present invention provides an electronic device comprising a heterojunction, wherein the heterojunction comprises a blend comprising an electron donor and an electron acceptor; and wherein the blend is treated so as to form one or more linkages between the electron donor and/or electron acceptor in the treated blend.

In a further aspect, the present invention provides a method of forming an electronic device which comprises: applying a blend comprising an electron donor and an electron acceptor to an assembly comprising a substrate to form a heterojunction; and treating the blend so as to form one or more linkages between the electron donor and/or acceptor in the treated blend, wherein the blend is treated before, during or after application of the blend to the assembly to form the heterojunction.

In a yet further aspect, the present invention provides an electronic device obtainable by a process comprising: forming a heterojunction on an assembly which comprises a substrate, wherein the heterojunction comprises a blend comprising an electron donor and an electron acceptor; and wherein the blend is treated so as to form one or more linkages between the electron donor and/or electron acceptor in the treated blend.

Preferred embodiments of the present invention are illustrated in the accompanying drawings in which.

The present invention relates to the finding that a stabilized heterojunction, comprising at least one electron donor and at least one electron acceptor, can be formed by the use of blends comprising the electron donor and electron acceptor which have been treated, either before, during or after application of the blend to a substrate to form, for example, a layer or film, so that the structure or morphology of the phase or phases of the treated blend is stabilized.

Generally, the terms "electron donor" and "electron acceptor" do not include solvents and other compounds that may not be directly involved in the functioning of the electronic device i.e., they are not active.

In one embodiment, the blend comprises a plurality of distinct, separate regions of the electron donor and electron acceptor. Preferably, the electron donor and acceptor form a phase separated blend, i.e., a blend comprising a plurality of distinct, separate regions, more preferably microscopic, of the different materials. Alternatively, the initially formed phase of the blend may not be substantially separated. Thus, the treatment of the blend may stabilize the initially formed phase or phases.

In one embodiment, the heterojunction comprises a blend comprising at least one electron donor and at least one electron acceptor. Thus, the heterojunction may comprise a blend comprising one, or more than one, electron donor and electron acceptor, such as three to ten, more preferably, three to six different donors or acceptors. Most preferably the blend comprises one electron donor and one electron acceptor.

Preferably, the heterojunction in the present invention is photoactive. The term "photoactive" is intended to mean that the heterojunction is capable of responding to light, or other forms of radiation, for example, to generate electrons for an electric current.

The term "heterojunction", as used herein, refers to a boundary between distinct regions, domains or phases of the at least one electron donor and acceptor. As used herein, the term heterojunction is not limited to one heterojunction but also includes a plurality of heterojunctions or interfaces between the at least one donor and acceptor. In a preferred embodiment, the device comprises a plurality of heterojunctions, for example greater than 100. By "electron donor" and "electron acceptor", it is intended to mean that the respective components can be involved, for example, in the movement of electrons or holes between or through the regions of materials, and/or the movement of electrons between different energy levels within the components.

In one embodiment, the heterojunction comprises a plurality (e.g., greater than 100) of regions of the at least one electron donor and electron acceptor where the regions comprise separate phases i.e., are phase separated from each other. Preferably, the phase separation is nanoscale phase separation and involves the formation of a mosaic of separate phases. Advantageously, the formation of one or more linkages fixes or stabilizes the different phases in the heterojunction. It is particularly preferred where the regions of the blend are non-uniform, for example, non-liquid crystalline.

The term "oligomer" as used herein, refers to a compound of relatively low molecular weight containing more than two monomer units, and for example, up to ten monomer units. The term "polymer", as used herein, refers to molecules made up of more than two repeating monomer units, for example from 10 to 100,000, more preferably from 100 to 10,000, monomer units.

In the following, the term "blend" and the term "initial blend" are intended to refer the same composition, whereas the term "treated blend" is intended to refer to a composition with different structural and/or physical properties from the "blend" or "initial blend". Such differences in properties may be reflected in different glass transition temperatures, for example. The term "blend" is also interchangeable with the term "mixture". The blend or mixture may be homogenous or heterogeneous. Preferably the blend is an intimate mixture of the components.

Preferably, the blend or mixture should be such that the shortest path between adjacent domains of the electron donor or acceptor is sufficiently small to enable charge carriers to cross without difficulty, more preferably to be able to tunnel through an intervening domain of the other material.

The at least one electron donor and acceptor are preferably capable of producing a heterogeneous network in the heterojunction. This means that when the donor and acceptor are blended a heterogeneous mixture comprising one or more, preferably separate, phases is formed. Preferably, the mixture comprises multiple, separate, more preferably microscopic, domains of the donor and acceptor. In a particularly preferred embodiment, the donor and acceptor may form a phase-separated blend, as described in U.S. Pat. No. 5,670,791.

In one embodiment, the desired phase separated state may be formed after annealing and then cross-linked either at room temperature, such as, for example, from 0° C. to 40° C., or the annealed phase may be cross-linked at more elevated temperatures, such as, for example, greater than 40° C., more preferably greater than 50° C., such as from 60° C. to 150° C.

For example, for devices comprising polyhexylthiophenes and PCBM, a particularly advantageous performance is observed after annealing to about 110° C. for a short time, such as about 1 to 10 minutes.

Thus, in certain embodiments of the present invention, there may preferably be some initial phase separation present in the blend before treatment. However, the formation of one or more, preferably a plurality, of linkages between the electron donor and/or acceptor in the blend may prevent, limit or lessen further phase separation, which can affect the performance or lifetime of a device.

The treatment of the blend to form one or more linkages between the electron donor and/or acceptor in the blend may be any process that can induce linkage formation, preferably without substantially altering the initially formed structure or morphology of the blend. Since linkages are formed in the treated blend, it is implicit that at least one of the electron donor or acceptor in the initial blend is capable of forming such linkages.

The term "linkage" as used herein is intended to mean a chemical bond between atoms and/or groups of atoms. Preferably, the chemical bond is a covalent bond. In one embodiment, the covalent bond comprises a carbon atom. In addition, the covalent bond includes a further atom, such as, for example, carbon, hydrogen, oxygen, nitrogen or sulphur.

Linkages may be formed between, for example, one set of molecules or monomers in the blend carrying reactive groups, so that a polymer is formed in the treated blend, between two sets of monomers in the blend carrying reactive groups so that a copolymer is formed in the treated blend, or between one preformed polymer and a monomer, or two preformed polymers, resulting in partial or complete cross-linking of the components in the treated blend. Other combinations are also possible. The term "preformed" in regard to polymers means that the polymers are formed, i.e., polymerization has taken place, before inclusion into the blend.

In one embodiment, the blend is treated so as to form a plurality of linkages. The number of linkages is preferably such that the treated blend comprises a stabilized structure, morphology or heterogeneous network. The term "structure" is intended to mean the structure of the treated blend as a whole, i.e., the bulk structure of the phase or phases of the blend, rather than the molecular structure of the individual materials that form the blend.

By the term "stabilized", it is intended to mean that the structure or morphology of the treated blend forming the heterojunction is more stable on exposure to heat and/or light under operational, storage or processing conditions compared to the structure or morphology of a comparable blend that has not been treated and whose structural stability has been measured under the same conditions. By "stable", it is intended to mean that the treated blends according to the present invention show less tendency to, for example, undergo any or further phase separation during operation, and more generally that the performance of the treated blends, in terms of efficiency, for example, shows less decline over time than untreated blends and that devices comprising the treated blends may have an improved lifetime. In particular, the structure of the treated blends may be less susceptible to being changed by heat and light compared to the structure of untreated blends.

In one embodiment, the heterojunction comprises a heterogeneous mixture of a plurality of separate distinct phases corresponding to the donor and acceptor compounds in the blend, and the heterojunction is stabilized or fixed by the formation of one or more linkages between the same and/or different phases of the materials in the blend.

The heterojunctions of the present invention will therefore be structurally different from heterojunctions comprising blends of, for example, apparently similar polymers that have not been treated. The structural differences may arise from the formation of linkages, for example by polymerization or cross-linking, in the presence of the other materials in the blend.

It is preferred that the donor and acceptor in the blend retain substantially most of their properties, preferably all of their properties, such as electronic properties, following the treatment according to the present invention. Thus, it is preferred that the treated blend retains its functionality in device applications.

Preferably, the treated blends are stable at a temperature of from 0° C. to 120° C. for different heat cycles at a desired wavelength. More preferably, the treated blends are stable at a temperature of from 0° C. to 80° C. for different heat cycles and at the wavelengths of the solar spectrum, such as from 200 to 2500 nm.

According to the present invention, the structure or morphology of the blend or heterojunction phase or phases is fixed, or made more stable, by chemically linking together the electron donor and/or acceptor of the blend in the presence of the other material(s) of the blend, before, during or after the formation of the device in which the blend is to be used. Hence, one or more linkages are formed between the same and/or different materials in the blend.

The term "fixed" as used herein is interchangeable with "thermodynamically stable" and is intended to mean that the structure of the phase or separated phases of the treated blend change less under the influence of heat and/or light during use of the device than untreated blends. Preferably, there is substantially no change in the structure of the treated blends under operational conditions. In particular, the term "stable" is intended to mean that the blends of the present invention may be more stable relative to blends which have not been treated to form linkages, as described above.

In one embodiment of the invention, the electron donor and acceptor are organic materials (i.e., containing at least carbon and a plurality of carbon-carbon single and/or double bonds and preferably also hydrogen and carbon-hydrogen bonds).

In a further embodiment of the present invention, the device comprises an organic bulk heterojunction. Preferably, the heterojunction comprises organic electron donor and electron acceptor materials. Thus, it is preferred that the organic blends form charge transfer materials which enable photo-initiated charge separation i.e., the materials have different electron affinities and energy gaps.

To illustrate the stabilization in the heterojunctions of one embodiment of the present invention, the blend of poly(phenylene vinylene) (PPV) and fullerene known in the art has been compared to spaghetti with meatballs. In such a system, both components can move freely, thus giving rise to phase separation. Without wishing to be bound by theory, this phase separation is believed to be the major cause for the rapid degradation of the photovoltaic cell, for instance upon heating. By way of continuing the above analogy, the treatment of the present invention can, in certain embodiments, be considered as linking some or all of the meatballs (i.e., fullerenes) together in a 3D network or linking spaghetti to spaghetti and spaghetti to meatballs (or all three). As a result, the system can no longer move, thus it can no longer degrade by phase separation. As a result, a thermodynamically stable blend (and therefore heterojunction) may be obtained, at the very least compared to a comparable untreated blend.

In the invention, the blend comprises a mixture of at least one electron donor and at least one electron acceptor. Examples of suitable donor-acceptor pairs include polymer-fullerene, polymer-perylene, polymer-polymer and polymer-quantum dot.

In a preferred embodiment of the invention, one or both of the polymers of a polymer-polymer pair is formed by the treatment of the blend. However, the blends of the present invention may also suitably comprise preformed polymer-polymer pairs, which are then subjected to treatment.

Suitable preformed polymer-polymer pairs include, for example, mixtures of copolymers. Examples of copolymers include those derived from aromatic carbocyclic monomers and aromatic monomers comprising heteroatoms, such as, for example, heterocycles and polycyclic aromatic amines such as polyphenylamines. A preferred carbocyclic monomer is fluorene, optionally substituted at the aromatic or non-aromatic positions with $C_1$ to $C_{20}$ alkyl. Particularly preferred heterocycles include, for example, thiophenes and preferred polyphenylamines include pentadiphenylamines, wherein the heterocycles and polyphenylamines can be optionally substituted with, for example, halo, cyano, $C_1$ to $C_{20}$ alkyl, $C_1$ to $C_{20}$ alkoxy, carboxylic ester, carboxylic acid amide or thiol.

In a preferred embodiment, the blend comprises polybenzothiazole-co-fluorene and polyfluorene-co-pentaphenyldiamine, preferably in a weight ratio of from 5:1 to 1:5, more preferably in a weight ratio of about 1:1.

Preferably, the blend comprises two or more different semiconducting materials, for example, two polymers, or a polymer and an organic material, or a polymer or organic material and an inorganic material.

The term "semiconducting material" as used herein, includes a substance whose electrical conductivity is intermediate between a metal and an insulator; its conductivity increases with temperature and in the presence of impurities. Conductors generally have a resistivity below $10^{-5}$ $\Omega$m, preferably at 25° C. and atmospheric pressure. Semiconductors generally have resistivities in the range $10^{-5}$ $\Omega$m to $10^8$ $\Omega$m, preferably at 25° C. and atmospheric pressure and a conductivity of from $10^{-14}$ to $10^{-1}$ S/cm. Insulators generally have a resistivity above $10^8$ $\Omega$m, preferably at 25° C. and atmospheric pressure.

The term "semiconductive polymer" means any polymer in which sufficient conjugation is present to enable the percolation threshold for charge conduction to be reached, as defined in U.S. Pat. No. 5,670,791. Suitable semiconductive polymers for use in the present invention include those mentioned in U.S. Pat. No. 5,670,791 and the contents of this document are incorporated herein by reference.

In one embodiment of the present invention, the electron donor and/or the electron acceptor is polymerizable, oligomerizable or cross-linkable. The electron donor and electron acceptor may be, for example, organic or inorganic compounds. However, preferably the donor and acceptor are both organic compounds. Thus, the structure or morphology of the blend phase or phases may be stabilized, for example, by the polymerization of an electron donor, an electron acceptor or, alternatively, the polymerization of an electron donor and an electron acceptor.

The blends of the invention may comprise, for example, two or more different preformed polymers that can be cross-linked to themselves and/or to each other, or at least one preformed polymer and at least one non-polymer that can be polymerized or cross-linked (with or to itself and/or to the preformed polymer) in the presence of the preformed polymer.

In one embodiment of the invention, the electron acceptor, preferably organic, is subject to bulk polymerization in the blend after the blend of the electron donor, preferably organic, and electron acceptor has been formed. One advantage of this is that large aliphatic side chains do not need to be used to keep the polymer soluble. This can lead to improved morphology of the electron acceptor layer and an electron acceptor having improved characteristics. Furthermore, the electron donor/acceptor heterojunctions in photovoltaic cells may have improved stability when the electron acceptor polymer is formed in the blend, because the electron donor materials become tangled in the electron acceptor polymer network.

Without wishing to be bound by theory, it is thought that the origin of the increased stability, at least in part, can be attributed to the partial or complete entanglement of the polymers, i.e., the electron donor polymer, for example PPV, and the polymerized electron acceptor, for example derivatized fullerene, during polymerization. However, this does not rule out the formation of covalent bonds between the electron donor and/or electron acceptor regions or phases (i.e., regions or phases in a macroscopic as well as a microscopic sense) contributing to the enhanced stability.

The electron acceptor used to form the blend and the electron acceptor regions of the heterojunction may comprise any suitable material, such as those known to be suitable photoreceptors. The blends with an electron donor can be formed by any suitable method, such as, for example, mixing of solutions and removal of solvents and co-melting of the components.

Suitable electron acceptors include, for example, poly(cyanaophenylenevinylene) ("CN-PPV"), fullerene molecules, such as $C_{60}$, $C_{70}$, $C_{76}$ and $C_{78}$ and functional derivatives of fullerene such as, for example, PCBM.

In a preferred embodiment of the invention, the electron acceptor is a fullerene monomer. Suitably, the electron acceptor may also be any fullerene that has been derivatized or functionalized such that it is polymerizable, oligomerizable or cross-linkable whilst maintaining the fullerene unit intact.

In a preferred embodiment, the electron acceptor is a functionalized fullerene, preferably, a functionalized methanofullerene derivative.

Advantageously, the electron donor and/or acceptor is a conjugated polymer. Examples of typical semiconducting conjugated polymers include, but are not limited to, polyacetylene ("PA") and its derivatives; polyisothianaphene and its derivatives; polythiophene ("PT"), and its derivatives; polypyrrole ("PPr") and its derivatives; poly(2,5-thienylenevinylene), ("PTV"), and its derivatives; poly(p-phenylene), ("PPP") and its derivatives; polyfluorene ("PF") and its derivatives; poly(phenylene vinylene) ("PPV") and its derivatives; polycarbazole and its derivatives; poly(1,6-heptadiyne); polyquinolene and semiconducting polyanilines (i.e., leucoemeraldine and/or the emeraldine base form). Representative polyaniline materials are described in U.S. Pat. No. 5,196,144, the contents of which are incorporated herein by reference. Of these materials, those that exhibit solubility in organic solvents are preferred because of their ease of processing. Examples of PPV derivatives that are soluble in common organic solvents include poly(2-methoxy-5-(2'-ethyl-hexyloxy)-1,4-phenylene vinylene (MEH-PPV), poly (2-butyl-5(2-ethyl-hexyl)-1,4-phenylenevinylene (BuEH-PPV), poly(2,5-bis(cholestanoxy)-1,4-phenylenevinylene (BCHA-PPV). Examples of suitable soluble PTs include poly (3-alkylthiophenes).

It is preferred that the conjugated polymer is a poly(p-phenylene vinylene) (PPV), optionally substituted. In one embodiment of the present invention, the blend may comprise two or more differently substituted PPV polymers such that the electron donor and acceptor may both be derived from PPV. The phenylene ring of PPV may carry one or more of a number of different substituents or side groups, such as, for example, $C_1$ to $C_{20}$ alkyl, halo, cyano, nitro, thiol and $C_1$ to $C_{20}$ alkyoxy.

In a particularly preferred embodiment, the electron donor in the blend is poly[2-methoxy-5-(3,7-dimethyloctyloxy)]-p-phenylene vinylene (MDMO-PPV). Preferably, MDMO-PPV has been formed before incorporation into the blend.

Photoactive layers can be produced using two semiconducting organic materials in a donor/acceptor heterojunction structure. In these structures, the donor is typically a conjugated polymer and the acceptor may comprise, for example, poly(cyanaophenylenevinylene) ("CN-PPV"), fullerene molecules such as $C_{60}$ and its functional derivatives such as PCBM or other organic molecules commonly used in the art for photoreceptors. Examples of this heterojunction layer structure for a photoactive layer include, for example, PPV/$C_{60}$, MEH-PPV/$C_{60}$, PT/$C_{60}$, P3AT/$C_{60}$ and MEH-PPV/$C_{60}$, as described in WO 99/09603.

When the heterojunction of the present invention comprises organic blends with two or more phases with different electron affinities and optical energy gaps, nanoscale phase separation commonly occurs and heterojunctions form at the interfacial area. The phase(s) with higher electron affinity may act as an n-type conduction area while the phases with lower electron affinity (or lower ionization energy) may serve as a p-type conduction area. These organic blends form a class of charge-transfer materials, and enable the photo-initiated charge separation process. The materials in the blend are electron donors or electron acceptors.

To date, several organic solar cell systems have been described and most of these are based on a heterojunction between an electron-donating molecule and an electron-accepting molecule. The design of devices based on these materials can fall into two broad categories: planar heterojunction and bulk heterojunction. Planar heterojunction devices rely on diffusion of excitons to the donor-acceptor interface in order to achieve charge separation. Higher efficiency devices have generally been achieved by blending the donor and acceptor species together into a phase separated mixture to form a bulk heterojunction.

In one embodiment, the heterojunction of the present invention is a bulk heterojunction comprising the donor and acceptor species in a phase separated mixture.

One of the main disadvantages of the planar heterojunction system is the small contact area due to the difficulties of processing several layers of the donor and acceptor on top of each other. This can be overcome by evaporation. However, using cross-linkable donors and acceptors, the compounds can be spin-coated on top of each other.

Preferably, the blending of the materials is such that the blend (and the treated blend) comprises regions or domains of an electron donor joined together to form a first three dimensional continuous network or matrix of electron donor and regions or domains of an electron acceptor joined together to form a second three dimensional continuous network or matrix with the two networks passing through one another or interpenetrating.

In one embodiment, the heterojunction of the present invention consists of an interpenetrating network of donor and acceptor materials forming a bulk heterojunction. The two networks may optionally be continuous throughout the heterojunction.

Advantageously, the blends used in the present invention are soluble in a suitable solvent, or mixtures of solvents, such as, for example, chlorobenzene. This is advantageous because the blends can then be applied to a substrate using spin-coating techniques, for example. Other methods of forming the blends and applying the blends to a substrate that do not require the use of solvents e.g., melt-processing techniques may also be used, provided that the components of the blend are not sensitive to heat.

The weight ratio of the electron donor to acceptor in the blend may suitably be from, for example, about 20:1 to 1:20, preferably from about 10:1 to 1:10, more preferably from about 5:1 to 1:5, most preferably about 1:1.

The heterojunction of the present invention may be in the form of one or more distinct layers, but is more preferably in the form of a single layer film. As used herein, "film" means a continuous piece of a substance having a high length to thickness ratio and a high width to thickness ratio. Typical thicknesses of the active layer range from, for example, a few hundred Angstrom units, i.e., 300-5000 Å (1 Angstrom unit=$10^{-8}$ m). Although the active film thicknesses are not critical, device performance can typically be improved by using thinner films with optical densities of less than two in the spectral region of interest.

Typically, the one or more linkages are covalent linkages formed by polymerization, oligomerization or cross-linking of either one or both of the electron donor and electron acceptor.

In order to form the linkages, the blend may be treated with a suitable form of radiation capable of initiating bond formation. Any suitable compound capable of acting as, for example, an initiator for covalent bond formation may alternatively be used. Suitable treatments are described, for example, in EP 1300 430 and EP 1357 163.

Alternatively, covalent bond formation may be initiated by thermal treatment of the device, blend and/or heterojunction. In particular, heat may be used to initiate polymerization in the blend.

Annealing at a temperature of, for example, 50° C. to 300° C., preferably 70° C. to 200° C., more preferably from 90° C. to 150° C. may be carried out as the treatment of the blend in order to provide a plurality of linkages and stabilize the structure of the blend. Advantageously, the annealing is carried out under an inert atmosphere, for example under nitrogen.

In one embodiment, the radiation is selected from an electron beam or UV light. Any suitable electron beam treatment may be used, such as, for example, that described in Advanced Materials, 2003, 15, 2, pp 115-117. In particular, an electron beam can be used to induce cross-linking in an otherwise unreactive material and therefore in almost any organic material. However, other forms of radiation may also be suitable.

To form a material with a stabilized donor/acceptor heterojunction and/or blend, the molecular weight of the blend constituents may, for example, be increased. Preferably, a material with an increased glass transition temperature is obtained and, most preferably, the molecular weight increase is realized in the treated blend in such a way that the blended components form connected stable and continuous phases.

In one embodiment, the treated blend has a higher glass transition temperature than the untreated blend. An increased glass transition temperature can be considered to be a physical manifestation of a structure or morphology having increased stability.

In order to enable linkages to be formed during treatment of the blend, the electron donor and/or electron acceptor preferably comprises at least one reactive group. The reactive group may be any group capable of leading to the formation of, for example, covalent linkages between molecules. Typical reactive groups include, for example, acrylates, methacrylates, vinyl ethers, epoxides, oxetanes, acetylenes and diacetylenes.

In one embodiment, the treatment is carried out substantially directly following the formation of the heterojunction.

Preferably, in order to form a stabilized donor/acceptor heterojunction, the electron donor and acceptor in the blend are treated and the electron donor and/or electron acceptor are linked together directly after processing, such as spin coating, to form the heterojunction. It is also preferred in this case that one or both of the electron donor and electron acceptor comprises reactive groups including, for example, acrylates, methacrylates, vinyl ethers, epoxides, oxetanes, acetylenes and diacetylenes.

The electronic device of the present invention is preferably selected from, for example, a photovoltaic device, a solar cell, a photodetector, an ambipolar transistor, an LED, a display or an electroluminescent device. It is particularly preferred that the device is a photovoltaic device or a solar cell.

The device typically comprises a first and second electrode to form a cathode and anode. The electrodes may be constructed from any of the materials generally known in the art. It is preferred that at least one of the electrodes is transparent or light transmissive for a desired wavelength range, when the device is to be used in photoapplications. Therefore, for these devices, materials that are known to provide transparent electrodes are generally preferred. For example, one of the electrodes (anode) may be formed of indium oxide or indium-tin oxide. The other electrode (cathode) may be formed of any suitable electrically conductive material, generally a metal or metal alloy that is more electronegative than indium tin oxide, for example, aluminium, magnesium, calcium or silver. However, other suitable materials may also be used, as described in WO 99/39395.

The first and second electrodes may be formed according to any of the methods known in the art, such as by evaporation, chemical vapour deposition or sputtering. In a preferred embodiment, the first electrode is formed onto a substrate. Alternatively, a substrate-electrode combination, such as, for example, polyester coated with indium tin oxide may be obtained commercially.

In one embodiment, the heterojunction is formed between the cathode and anode, to form a sandwich structure.

Advantageously, the blend or treated blend (e.g., an unstabilized or stabilized donor/acceptor network) may be spin coated onto the assembly, preferably a substrate-electrode composite, out of the same solution. The solution may comprise any suitable solvent. Preferably, the solvent is volatile and so can be easily removed following application to the substrate. The solvent may be removed by, for example, annealing in vacuo at a temperature of, for example, 100° C. for a sufficient time, generally a few hours, to remove the residual solvent.

In one embodiment, the second electrode is provided on the heterojunction using any suitable technique, such as, for example, evaporation, sputtering or chemical vapour deposition (CVD). Preferred solvents for spin coating include, for example, toluene, xylene, chlorobenzene, dichlorobenzene, chloroform, dichloromethane and tetrahydrofuran.

The substrate is a solid, rigid or flexible layer designed to provide robustness to the device. For photoapplications, it is preferred that the substrate is transparent. In particular, when light is incident from the substrate side, the substrate should be transparent or semi-transparent in the spectral region of interest. The term "transparent" is used to describe a substrate with transmittance over 50% and the term "semi-transparent" is used to describe a substrate with transmittance between 50% to 5%. The substrate may comprise any suitable material known in the art. Glass, polymer sheets, or flexible plastic films, for example PET films, are substrates commonly used. Further examples of suitable substrates are described in WO 99/39395, which is incorporated by reference herein.

A particularly preferred substrate comprises poly(ethylenedioxythiphene)-polystyrene sulphonate (PEDOT:PSS, Baytron P), optionally covered with indium-tin oxide (ITO) substrate.

In general, the blend may be treated before, during or after it has been applied to a substrate, wherein the substrate optionally further comprises an electrode which may be a cathode or anode, preferably a cathode.

In one embodiment of the invention, the blend comprising at least one electron donor and electron acceptor is applied by any suitable technique, preferably spin coating, to the substrate before treating to form the one or more linkages and thereby fixing the structure or morphology of the phase or phases of the heterojunction.

Alternatively, the blend may be formed, by for example, co-melting the components or co-dissolving the components in a suitable solvent, or any other suitable method, followed by treatment to form a stabilized structure or morphology and then application of the treated blend to the substrate of an electronic device.

In one embodiment of the invention, during the treatment and linking process the structure or morphology of the blend or network remains substantially unchanged. Hence, the use of heat at a level that could lead to significant molecular motion and the disruption of the structure and any heterogeneous network is preferably avoided. Therefore, in order to avoid any potential molecular disruption caused by heating, it is preferred that the reaction is induced via radiation such as electron beam or UV light. However, limited amounts of heat may be used to initiate, for example, cross-polymerization, as discussed above.

In the most preferred embodiment, the components of the blend are cross-linked directly after processing to form the heterojunction, so that the structure of the blend is chemically fixed or stabilized. To enable oligomerization, polymerization or cross-linking either one or both of the electron donor and acceptor carry reactive groups, although this is not essential.

The blends of the present invention may further comprise components that are optically active and that may assist in light harvesting by capturing and transferring excitons to one or other of the electron donor and/or electron acceptor in the blend, and/or optically non-active components to modify and/or improve the performance of the device.

In a preferred embodiment, the blend may further comprise one or more organic additives. Examples of suitable additives include anionic surfactants, for example, ether sulfates, and solid-state electrolytes or organic salts, as described in WO 99/09603.

The present invention is illustrated by reference to the following examples, which are not intended to limit the scope of the invention in any way.

EXAMPLES

Example 1

Crosslinking via Electron Beam Irradiation

Irradiation with an electron beam is an approach that has been used to fix or stabilize a blended organic material in accordance with the present invention.

BT

FB

Irradiation with an electron beam has been used to link a 1:1 (by weight) blend of polybenzothiazole-co-fluorene (BT) and polyfluorene-co-pentaphenyldiamine (FB). In order to provide irradiation, a compact electron-beam processor CB150 (from Energy Sciences, Inc.) was used. The electrons can be accelerated at a voltage of 157 kV and 50 to 150 Mrad exposures were used at room temperature, i.e., about 0 to 40° C.

The composition of these two copolymers showed a photovoltaic effect in an earlier publication by Halls et al (Adv. Mater., 12, 498 (2000)). However, the tendency of the blend to undergo phase separation was very high.

In accordance with the present invention, linking the two copolymers fixes the structure or morphology of the blend and thus increases the lifetime of the device. The process as defined in the present invention can also be used to fix or stabilize the morphology of a polymer and small molecule blend or even mixtures of different molecules. A particular advantage of electron beam crosslinking is that the treatment can be applied in combination with almost any blend comprising at least two organic materials.

Example 2

Preparation of the Tetrafunctional Methanofullerene 1

The strategy employed for the preparation of the functionalized methanofullerene derivative 1 in Scheme 1 is based upon Bingel type chemistry (C. Bingel, Chem. Ber. 126, 1957 (1993)). To this end, malonate 9 was prepared in six steps from 1-heptyne (2) and undec-10-ynoic acid (3) (Scheme 1).

1

Scheme 1. Preparation of methanofullerene derivative 1. Reactant and conditions: (a) CuCl, TMEDA, dry air, $CH_2Cl_2$, room temp., 24 h (40%); (b) $LiAlH_4$, THF, 0° C., 4 h (95%); (c) TsCl, pyridine, DMAP, $CH_2Cl_2$, 0° C., 18 h (64%); (d) methyl 3,5-dihydroxybenzoate, $K_2CO_3$, DMF, 70° C., 24 h (71%); (e) $LiAlH_4$, THF, 0° C., 3 h (75%); (f) malonyl chloride, pyridine, DMAP, $CH_2Cl_2$, room temp., 20 h (62%); (g) $C_{60}$, $I_2$, DBU, toluene, room temp., 14 h (53%).

Reaction of 2 and 3 in $CH_2Cl_2$ under dry air in the presence of an excess of the Hay catalyst (CuCl, N,N,N',N'-tetramethylethylenediamine=TMEDA, dry air) furnished compound 4 in 40% yield. $LiAlH_4$ reduction of 4 followed by treatment of the resulting 5 with p-toluenesulfonyl chloride (TsCl) in the presence of pyridine and 4-dimethylaminopyridine (DMAP) in $CH_2Cl_2$ yielded tosylate 6.

Subsequent reaction with methyl 3,5-dihydroxybenzoate under classical Williamson conditions afforded ester 7 in 71% yield. Reduction with $LiAlH_4$ then gave benzylic alcohol 8 in 75% yield. Treatment of 8 with malonyl chloride in $CH_2Cl_2$/pyridine finally afforded malonate 9. The reaction of $C_{60}$ with compound 9, iodine and 1,8-diazabicyclo[5.4.0]undec-7-ene (DBU) under Bingel conditions then gave methanofillerene 1 in 53% yield. The structure and purity of compound 1 were confirmed by $^1H$- and $^{13}C$-NMR spectroscopy, mass spectrometry and elemental analysis.

Compound 1 could be stored for several months in the freezer without significant degradation. It is also reasonably stable at room temperature in the neat state. In contrast, when compound 1 is heated at 100° C. for 1 h, an insoluble dark red material is obtained suggesting that polymerization has occurred. It should be noted that the UV/vis spectra of spin coated thin films of compound 1 before and after heating at 100° C. for one hour are similar. The latter observation shows that the fullerene chromophore is not affected by the polymerization of the butadiyne subunits. In addition, it also reveals that the solid state reaction of the butadiyne moieties does not produce polydiacetylene (PDA) polymers. Formation of PDA polymers is not expected since the reactive subunits are not preorganized to allow the formation of extended conjugated PDA chains.

Data for Compound 1:

$^1H$-NMR ($CDCl_3$, 200 MHz): δ=0.90 (t, $^3J$=6 Hz, 12H), 1.20-1.85 (m, 80H), 2.24 (t, $^3J$=6 Hz, 16H), 3.89 (t, $^3J$=6 Hz, 8H), 5.43 (s, 4H), 6.40 (s, 2H), 6.58 (d, $^4J$=2 Hz, 4H); $^{13}C$-NMR ($CDCl_3$, 50 MHz): δ=13.96, 19.10, 22.08, 26.01, 27.96, 28.24, 28.76, 28.96, 29.18, 29.29, 29.34, 30.91, 51.75, 65.27, 65.31, 67.93, 68.71, 77.36, 77.63, 101.48, 106.70, 136.49, 138.89, 140.69, 141.71, 142.00, 142.78, 142.86, 143.65, 144.31, 144.39, 144.49, 144.71, 145.04, 144.82, 144.95, 145.00, 145.05, 160.37, 163.18; IR (CH$_2$Cl$_2$): 1749 cm$^{-1}$ (C=O); Elemental analysis calc. for C$_{149}$H$_{126}$O$_8$: C, 87.53%, H, 6.21%; found C, 82.97%, H, 5.96%; FAB (MS): 2044.8 (25%, M$^+$, calc. for C$_{149}$H$_{126}$O$_8$: 2044.63); 720.0 (100%, [C$_{60}$]$^+$, calc. for C$_{60}$: 720.00).

Example 3

Test of Crosslinked Materials in Solar Cells Using Ca/Al Cathode

In order to test the potential of fullerene derivative 1 for photovoltaic applications, solar cells were prepared with blends of 1 and MDMO-PPV, then characterized before any thermal treatment. A mixture of MDMO-PPV and 1 (1:5 by weight) was spin coated from a chlorobenzene solution on top of a 100 nm (surface profiler (Veeco Dektak 3ST)) thick layer of poly(ethylene dioxythiophene)-polystyrene sulphonate (PEDOT:PSS, Baytron P)-covered indium-tin oxide (ITO) substrate. The resulting thickness of the layer was determined with a surface profiler to be 90 nm. Calcium (15 nm) and aluminium (150 nm) were evaporated on the composite layer.

Figure 1:
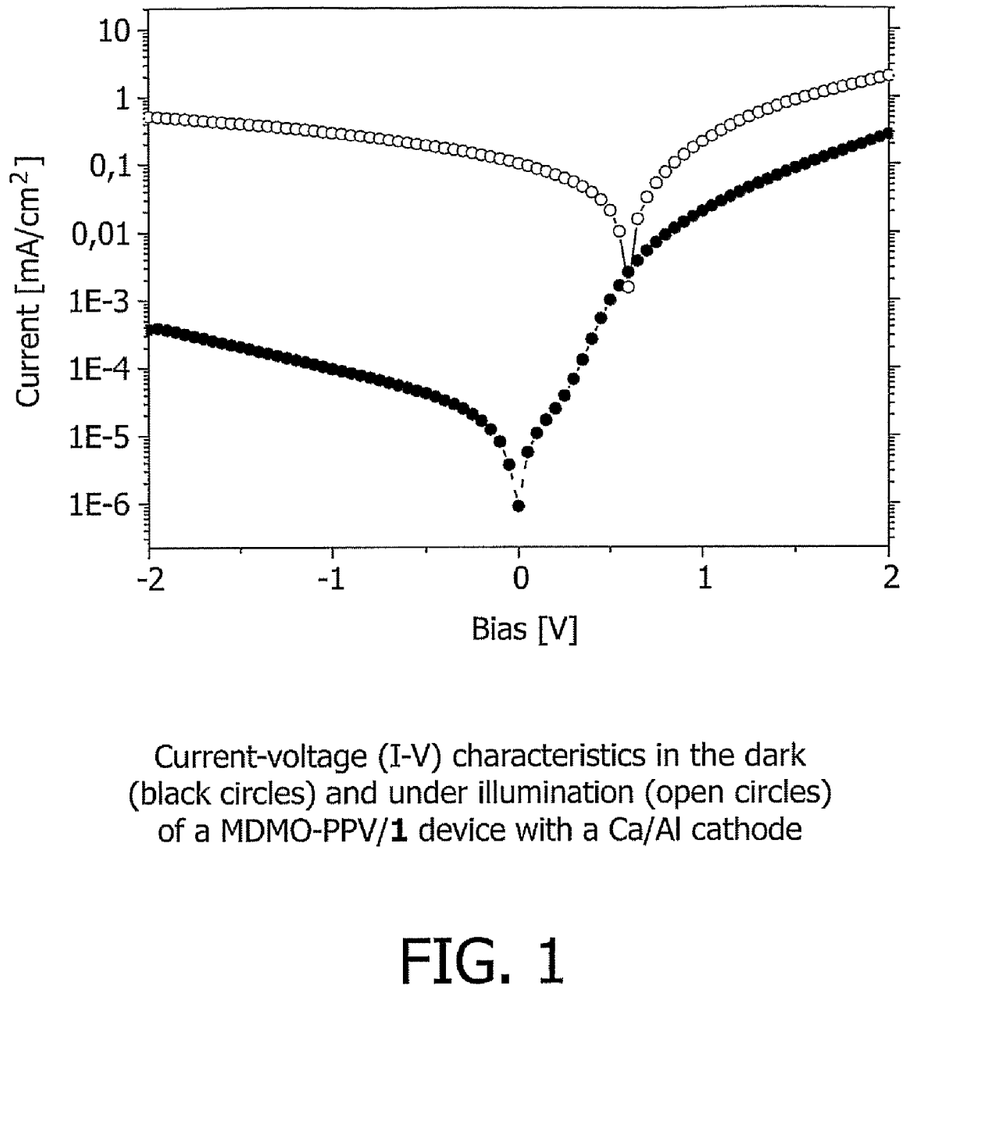
FIG. 1 shows the current-voltage (I-V) characteristics in the dark (black circles) and under illumination (open circles) of a MDMO-PPV/1 device with a Ca/Al cathode according to the present invention.

The devices were measured under nitrogen in a glove box. The current voltage (I/V) characteristics in the dark and under illumination (standard AM1.5 conditions) are shown in FIG. 1. These cells exhibit short circuit current ($I_{sc}$) of 0.1 mA/cm$^2$, open circuit voltage ($V_{oc}$) of 0.59 V and fill factor of 0.27.

Example 4

Test of Crosslinked Materials in Solar Cells Using Ag Cathode

In a second set of experiments, the Ca/Al cathode in Example 3 was replaced by silver (150 nm). To study their thermal stability, these devices (from Example 3 and 4) were annealed at 100° C. for 2 hours in the glove box. During this treatment, polymerization of 1 might occur. In addition, the influence of the remaining solvent present in the active layer on the cathode is thus reduced.

Interestingly, the annealing resulted in a slight improvement of the performances (before annealing: $I_{sc}$=0.034 mA/cm$^2$, $V_{oc}$=0.6 V, FF=0.22; after annealing $I_{sc}$=0.037 mA/cm$^2$, $V_{oc}$=0.61 V, FF=0.26). This effect has also been observed for polythiophene/PCBM composites, but it can be noted that the MDMO-PPV/PCBM devices degrade through annealing.

In order to gain more insight into the morphological changes occurring during the thermal treatment, tapping mode atomic force microscopy (TM-AFM) studies have been carried out. The TM-AFM pictures of the MDMO-PPV/1 film (FIG. 2) show features of 0.2-0.6 µm widths and a height difference of 60 nm. Through annealing the roughness of the surface increases (height difference of 70 nm).

Figure 2:
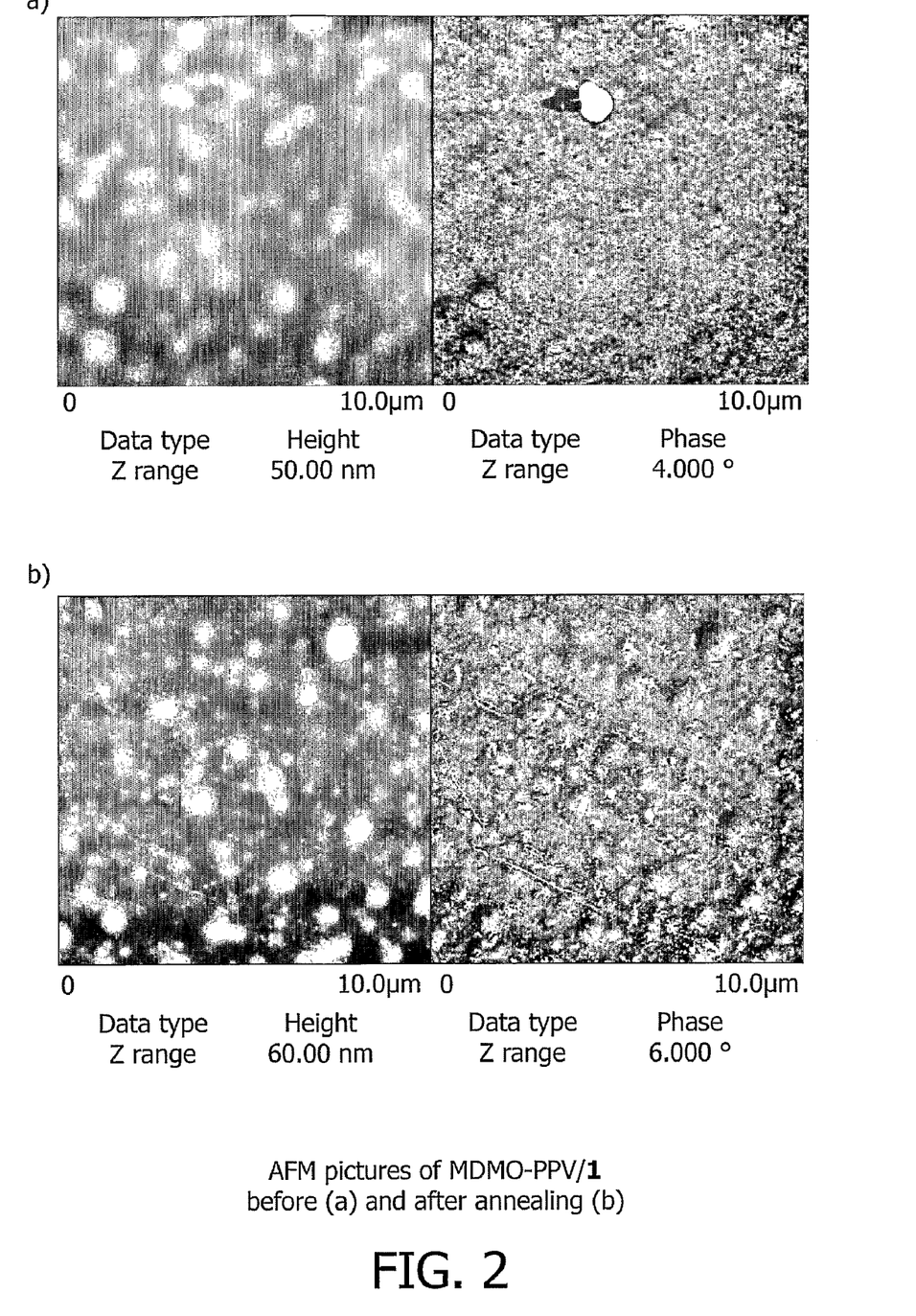
FIG. 2 shows AFM pictures of MDMO-PPV/1 before (a) and after annealing (b).

Additionally, new features with a diameter of 0.1-0.4 µm can be observed in the height and phase picture. The morphological changes observed after annealing MDMO-PPV/1 are however much smaller than the observed separated phases in the MDMO-PPV/PCBM composites. This is a clear indication that the cross-linking of compound 1 is capable of stabilizing the initially formed phase.

The invention claimed is:

1. An electronic device comprising a heterojunction, wherein the heterojunction comprises a blend comprising an electron donor and an electron acceptor; and wherein the blend is treated so as to form one or more linkages between the electron donor and/or electron acceptor in the treated blend.

2. A device according to claim 1, wherein the blend comprises a plurality of distinct, separate regions of the electron donor and electron acceptor.

3. A device according to claim 1, wherein the electron donor and/or, the electron acceptor is polymerizable, oligomerizible or cross-linkable.

4. A device according to claim 3, wherein the electron acceptor is a fullerene monomer.

5. A device according to claim 1, wherein the electron acceptor and/or electron donor is a conjugated polymer.

6. A device according to claim 5, wherein the conjugated polymer is a poly(phenylene-vinylene), optionally substituted.

7. A device according to claim 1, wherein the heterojunction consists of an interpenetrating network of donor and acceptor materials forming a bulk heterojunction.

8. A device according to claim 7, wherein the network is continuous throughout the heterojunction.

9. A device according to claim 1, wherein the one or more linkages are covalent linkages formed by polymerization, oligomerization or cross-linking of one or both of the electron donor and electron acceptor.

10. A device according to claim 1, wherein the blend is treated with radiation.

11. A device according to claim 10, wherein the radiation is selected from an electron bean or UV light.

12. A device according to claim 1, wherein the electron donor and/or electron acceptor comprises at least one reactive group.

13. A device according to claim 1, wherein the treatment is carried out substantially directly following the formation of the heterojunction.

14. A device according to claim 1, which is selected from a photovoltaic device, a solar cell, a photodetector, an ambipolar transistor, an LED, a display or an electroluminescent device.

15. A device according to claim 1, wherein the device comprises a first and second electrode to form a cathode and anode.

16. A device according to claim 15, wherein the heterojunction is formed between the cathode and anode.

17. A device according to claim 1, wherein the donor/acceptor network has been spin coated onto the assembly out of the same solution.

18. A device according to claim 1, wherein the structure of the blend remains substantially unchanged during the formation of the linkages.

* * * * *